United States Patent
Maeda et al.

(10) Patent No.: US 9,404,693 B2
(45) Date of Patent: Aug. 2, 2016

(54) HANDLER PROVIDED WITH A TEMPERATURE CONTROL UNIT

(71) Applicant: Seiko Epson Corporation, Tokyo (JP)

(72) Inventors: Masami Maeda, Suwa (JP); Toshioki Shimojima, Suwa (JP)

(73) Assignee: Seiko Epson Corporation (JP)

( * ) Notice: Subject to any disclaimer, the term of this patent is extended or adjusted under 35 U.S.C. 154(b) by 619 days.

(21) Appl. No.: 13/756,941

(22) Filed: Feb. 1, 2013

(65) Prior Publication Data

US 2013/0206383 A1     Aug. 15, 2013

(30) Foreign Application Priority Data

Feb. 14, 2012   (JP) .................................. 2012-029179

(51) Int. Cl.
| | |
|---|---|
| *F25B 5/00* | (2006.01) |
| *F28F 27/00* | (2006.01) |
| *H01L 21/67* | (2006.01) |
| *G01R 31/28* | (2006.01) |

(52) U.S. Cl.
CPC ............ *F28F 27/00* (2013.01); *G01R 31/2867* (2013.01); *G01R 31/2874* (2013.01); *H01L 21/67109* (2013.01); *H01L 21/67248* (2013.01); *G01R 31/2868* (2013.01)

(58) Field of Classification Search
CPC ...... F28F 27/00; F28F 27/02; G01R 31/2877; G01R 31/2875; G01R 31/2874; G01R 31/2867; H01L 21/67098; H01L 21/67248
USPC .................... 62/129, 199, 336, 337, 338, 339
See application file for complete search history.

(56) References Cited

U.S. PATENT DOCUMENTS

| | | | | | |
|---|---|---|---|---|---|
| 4,604,572 | A | * | 8/1986 | Horiuchi ............ | G01R 31/2877 324/750.03 |
| 4,721,462 | A | * | 1/1988 | Collins, Jr. ............ | B25B 11/005 248/362 |
| 4,787,752 | A | * | 11/1988 | Fraser ..................... | F24F 3/044 324/750.08 |
| 4,791,364 | A | * | 12/1988 | Kufis ................. | G01R 31/2868 324/750.08 |
| 5,126,656 | A | * | 6/1992 | Jones ................. | G01R 31/2862 324/750.07 |
| 5,294,778 | A | * | 3/1994 | Carman ............ | H01L 21/67103 118/725 |
| 5,807,066 | A | * | 9/1998 | Smith .................... | G01R 31/01 414/416.01 |
| 5,821,505 | A | * | 10/1998 | Tustaniwskyj ..... | G01R 31/2874 324/750.09 |

(Continued)

FOREIGN PATENT DOCUMENTS

| | | |
|---|---|---|
| JP | 2004-347329 | 12/2004 |
| JP | 2005-265665 A | 9/2005 |

(Continued)

*Primary Examiner* — Ljiljana Ciric
(74) *Attorney, Agent, or Firm* — Harness, Dickey & Pierce, P.L.C.

(57) ABSTRACT

A handler includes first and second cooling channels, and first and second supply channels. The first and second cooling channels correspond to housing pockets that are respectively heated by heaters. A first throttle valve controls the flow of refrigerant such that the amount of refrigerant flowing through the second cooling channel is larger than the amount of the refrigerant flowing through the first cooling channel. Temperature sensors detect the temperature of the respective housing pockets, and a control device controls the valve and the heaters so that a target temperature is maintained.

8 Claims, 5 Drawing Sheets

(56) References Cited

U.S. PATENT DOCUMENTS

| | | | | |
|---|---|---|---|---|
| 5,846,375 | A * | 12/1998 | Gilchrist | H01J 37/32724 118/723 E |
| 5,847,366 | A * | 12/1998 | Grunfeld | G01K 1/143 165/80.4 |
| 5,927,077 | A * | 7/1999 | Hisai | H01L 21/67103 219/444.1 |
| 5,966,940 | A * | 10/1999 | Gower | F25B 21/04 165/61 |
| 6,445,203 | B1 * | 9/2002 | Yamashita | G01R 31/2856 324/750.08 |
| 6,536,518 | B2 * | 3/2003 | Trieskey | F25B 5/02 62/196.4 |
| 6,593,761 | B1 * | 7/2003 | Fukasawa | G01R 31/2868 324/757.04 |
| 6,717,115 | B1 * | 4/2004 | Pfahnl | H01L 21/67103 118/724 |
| 7,049,841 | B2 * | 5/2006 | Yamashita | G01R 31/2868 324/750.13 |
| 7,159,599 | B2 * | 1/2007 | Verhaverbeke | H01L 21/67069 134/109 |
| 7,274,005 | B2 * | 9/2007 | Quach | H01L 21/67184 118/724 |
| 7,417,857 | B2 * | 8/2008 | Rondier | H01L 23/473 165/104.33 |
| 7,479,795 | B2 * | 1/2009 | Hayashi | G01R 31/2874 324/750.09 |
| 7,554,350 | B2 * | 6/2009 | Suga | G01R 31/2875 324/750.13 |
| 7,585,686 | B2 * | 9/2009 | Verhaverbeke | G03F 7/16 414/153 |
| 7,619,427 | B2 * | 11/2009 | Ando | G01R 31/2874 324/750.13 |
| 7,701,238 | B2 * | 4/2010 | Wong | G01R 31/2874 324/750.13 |
| 7,726,145 | B2 * | 6/2010 | Nakamura | G06F 1/20 62/259.2 |
| 7,741,585 | B2 * | 6/2010 | Quach | H01L 21/67109 118/724 |
| 8,269,517 | B2 * | 9/2012 | Teng | G01R 31/2893 324/750.13 |
| 8,319,141 | B2 * | 11/2012 | Ishida | H01J 37/32009 165/80.4 |
| 8,816,709 | B2 * | 8/2014 | Shiozawa | G01R 31/2891 324/750.13 |
| 8,895,889 | B2 * | 11/2014 | Zhang | H01J 37/32724 118/724 |
| 9,074,728 | B2 * | 7/2015 | Maeda | F17C 9/02 62/259.2 |
| 2012/0311858 | A1 | 12/2012 | Reitinger | |
| 2015/0377570 | A1 * | 12/2015 | Di Stefano | F25B 49/02 165/287 |

FOREIGN PATENT DOCUMENTS

| | | |
|---|---|---|
| JP | 2008-107014 A | 5/2008 |
| JP | 2008-128839 A | 6/2008 |
| WO | WO-2011-039087 A1 | 4/2011 |

\* cited by examiner

HANDLER PROVIDED WITH A TEMPERATURE CONTROL UNIT

BACKGROUND

1. Technical Field

The present invention relates to a handler which conveys a part, and more particularly to a handler provided with a temperature control unit for controlling the temperature of a part, and a part inspecting apparatus which includes this handler.

2. Related Art

A typical part inspecting apparatus which inspects the electric characteristics of an electronic part has a handler which conveys the electronic part before and after inspection between a tray on a base and an inspection socket. According to this part inspecting apparatus, there is a type which inspects the electric characteristics of an electronic part kept in a low-temperature condition at 0° C. or a lower temperature.

For example, there is disclosed a technology in JP-A-2004-347329, as a method for cooling an electronic part into a low-temperature condition. According to the method of JP-A-2004-347329, a tray provided with a plurality of support portions is placed on a stage to support electronic parts on the support portions. The stage contains a cooling channel to cool the tray via the stage. Refrigerant produced from cooled compressed air is supplied from a refrigerant supply unit to the cooling channel of the stage to cool the electronic parts via the tray.

When this structure is used to cool a plurality of stages, each of the stages requires a flow amount control valve capable of controlling the supply amount of refrigerant according to the temperature of the stage. In this case, piping for connection between the supply source of the refrigerant and the respective cooling channels becomes complicated. Moreover, the conditions of the plural flow amount control valves differ for each of the stages, wherefore heavy loads are applied to a controller which determines opening and closing for each of the flow amount control valves during supply amount control.

SUMMARY

An advantage of some aspects of the invention is to provide a handler capable of reducing heavy loads associated with controls performed by a controller which controls the temperatures of a plurality of parts supported on a plurality of support portions when the parts are cooled, and avoiding complication of a cooling circuit, and to provide a part inspecting apparatus including this handler.

An aspect of the invention is directed to a handler including: a first cooling channel through which refrigerant passes to cool a first support portion provided to support a part; a second cooling channel through which refrigerant passes to cool a second support portion different from the first support portion and provided to support a part; a first heater provided to heat the first support portion; a second heater different from the first heater and provided to heat the second support portion; a first temperature sensor provided to detect the temperature of the first support portion; a second temperature sensor different from the first temperature sensor and provided to detect the temperature of the second support portion; and a refrigerant supply unit which supplies refrigerant to the first and second cooling channels via a flow amount control valve. The first and second cooling channels are connected with the refrigerant supply unit in parallel. The handler further includes a controller which varies the opening and closing of the flow amount control valve and the output of the first heater in accordance with a detection value of the first temperature sensor, and varies the output of the second heater in accordance with a detection value of the second temperature sensor.

According to the handler of this aspect of the invention, the first cooling channel and the second cooling channel are connected with the refrigerant supply unit in parallel. In this case, the refrigerant is supplied to the first and second cooling channels from the refrigerant supply unit via the common flow amount control valve. Accordingly, the cooling circuit becomes less complicated than the cooling circuit of a structure which has the refrigerant supply unit for each of the first and second cooling channels.

Moreover, the controller varies the opening and closing of the flow amount control valve and the output of the first heater in accordance with the detection value of the first temperature sensor for the first support portion, but varies only the output of the second heater in accordance with the detection value of the second temperature sensor for the second support portion. In this case, the load given to the controller for the temperature control of the part decreases. Accordingly, simplification of the cooling circuit for cooling the part and reduction of the load on the controller for adjustment of the temperature of the part to the target temperature can be both achieved.

In the handler of the aspect of the invention, the first cooling channel may have a flow path through which a smaller amount of refrigerant flows than the flow amount of refrigerant flowing in the second cooling channel.

According to the handler of this configuration, the flow amount of refrigerant in the second cooling channel is larger than the flow amount of refrigerant in the first cooling channel. In this case, the second support portion is cooled to a temperature lower than the temperature of the first support portion. This structure can equalize the temperatures of the first and second support portions, and also can control the second support portion such that the temperature of the second support portion becomes lower than the temperature of the first support portion while achieving simplification of the cooling circuit and reduction of the load on the controller.

The handler of the aspect of the invention may further include a throttle valve which decreases the flow amount of refrigerant in the first cooling channel.

According to the handler of this configuration, the first throttle valve decreases the flow amount of refrigerant in the first cooling channel. In this case, the flow amount of refrigerant in the first cooling channel becomes smaller than that amount in the second cooling channel even when the cross-sectional area of the flow path of the first cooling channel is larger than the cross-sectional area of the flow path of the second cooling channel. Accordingly, the degree of freedom in designing the shapes and sizes of the first cooling channel and the second cooling channel becomes higher than that degree in a structure which does not have a similar throttle valve.

The handler of the aspect of the invention may further include: a housing vessel which accommodates the support portions; a first discharge channel which connects the outlet of the first cooling channel and the housing vessel; and a second discharge channel which connects the outlets of the second cooling channels and the housing vessel.

In a handler which cools a part to a temperature lower than the room temperature, an atmosphere which contains a smaller amount of water than that of the atmospheric air such as dry air and nitrogen gas is formed around the cooling channels and the support portions so as to prevent dew condensation and icing around the cooling channels and the support portions. According to the handler of the configuration described above, refrigerant containing a smaller amount of water is supplied to the housing vessel accommodating the support portions. Thus, dew condensation does not develop on the support portions, the parts supported on the support portions, or other portions having low temperatures.

The handler of the aspect of the invention may further include: a first non-return valve included in the first discharge channel to prevent flow of gas into the first cooling channel; and a second non-return valve included in the second discharge channel to prevent flow of gas into the second cooling channel.

In the case of the handler of this configuration, the flow of gas toward the first cooling channel is prevented in the first discharge channel, while the flow of gas toward the second cooling channel is prevented in the second discharge channel. According to this structure, the refrigerant having passed through the first cooling channel does not flow in the first discharge channel in the reverse direction to again enter the first cooling channel, and the refrigerant having passed through the second cooling channel does not flow in the second discharge channel in the reverse direction to again enter the second cooling channel. This structure can prevent reverse flow of the refrigerant whose temperature has been raised during passage through the first cooling channel and the atmospheric air coming from the housing vessel to enter the first cooling channel, and reverse flow of the refrigerant whose temperature has been raised during passage through the second cooling channel and the atmospheric air coming from the housing vessel to enter the second cooling channel. Accordingly, the first support portion and the second support portion can be effectively cooled by using the refrigerant supplied to the first cooling channel and the refrigerant supplied to the second cooling channel, respectively.

In the handler of the aspect of the invention, a portion of the second discharge channel on the downstream side with respect to the second non-return valve may be joined with a portion of the first discharge channel on the downstream side with respect to the first non-return valve.

According to the handler of this configuration, the cooling circuit on the refrigerant discharge side can also be simplified when compared with a structure which individually connects the first and second discharge channels to the housing vessel. Moreover, the refrigerant whose temperature has been raised during passage through the first cooling channel does not flow in the second discharge channel in the reverse direction to enter the second cooling channel, and the refrigerant whose temperature has been raised during passage through the second cooling channel does not flow in the first discharge channel in the reverse direction to enter the first cooling channel.

The handler of the aspect of the invention may further include a temperature raising unit which raises the temperature of refrigerant passing through the first discharge channel in a portion of the first discharge channel on the downstream side with respect to the position where the second discharge channel is joined with the first discharge channel.

In the case of the handler of this configuration, the refrigerant whose temperature has been raised by the temperature raising unit is introduced into the housing vessel. In this case, the temperature of the interior of the housing vessel becomes higher than that temperature in a structure which introduces refrigerant whose temperature has not been raised into the housing vessel. Thus, dew condensation within the housing vessel can be reduced.

The handler of the aspect of the invention may further include: a plurality of the second cooling channels; a first throttle valve which decreases the flow amount of refrigerant flowing in the first cooling channel; and second throttle valves provided for each of the plural second cooling channels to decrease the flow amounts of refrigerant flowing in the second cooling channels.

In the case of the handler of this configuration, variations in the flow amounts of refrigerant in the plural second cooling channels can be reduced by the functions of the second throttle valves included in the second cooling channels even when the flow amounts of refrigerant in the second cooling channels are different from each other.

Another aspect of the invention is directed to apart inspecting apparatus including: a first cooling channel through which refrigerant passes to cool a first support portion provided to support a part; a second cooling channel through which refrigerant passes to cool a second support portion different from the first support portion and provided to support a part; a first heater provided to heat the first support portion; a second heater different from the first heater and provided to heat the second support portion; a first temperature sensor provided to detect the temperature of the first support portion; a second temperature sensor different from the first temperature sensor and provided to detect the temperature of the second support portion; and a refrigerant supply unit which supplies refrigerant to the first and second cooling channels via a flow amount control valve. The first and second cooling channels are connected with the refrigerant supply unit in parallel. The part inspecting apparatus further includes a controller which varies the opening and closing of the flow amount control valve and the output of the first heater in accordance with a detection value of the first temperature sensor, and varies the output of the second heater in accordance with a detection value of the second temperature sensor.

The part inspecting apparatus of this aspect of the invention can achieve both simplification of the cooling circuit for cooling the part, and reduction of the load on the controller imposed when controlling the temperature of the part.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
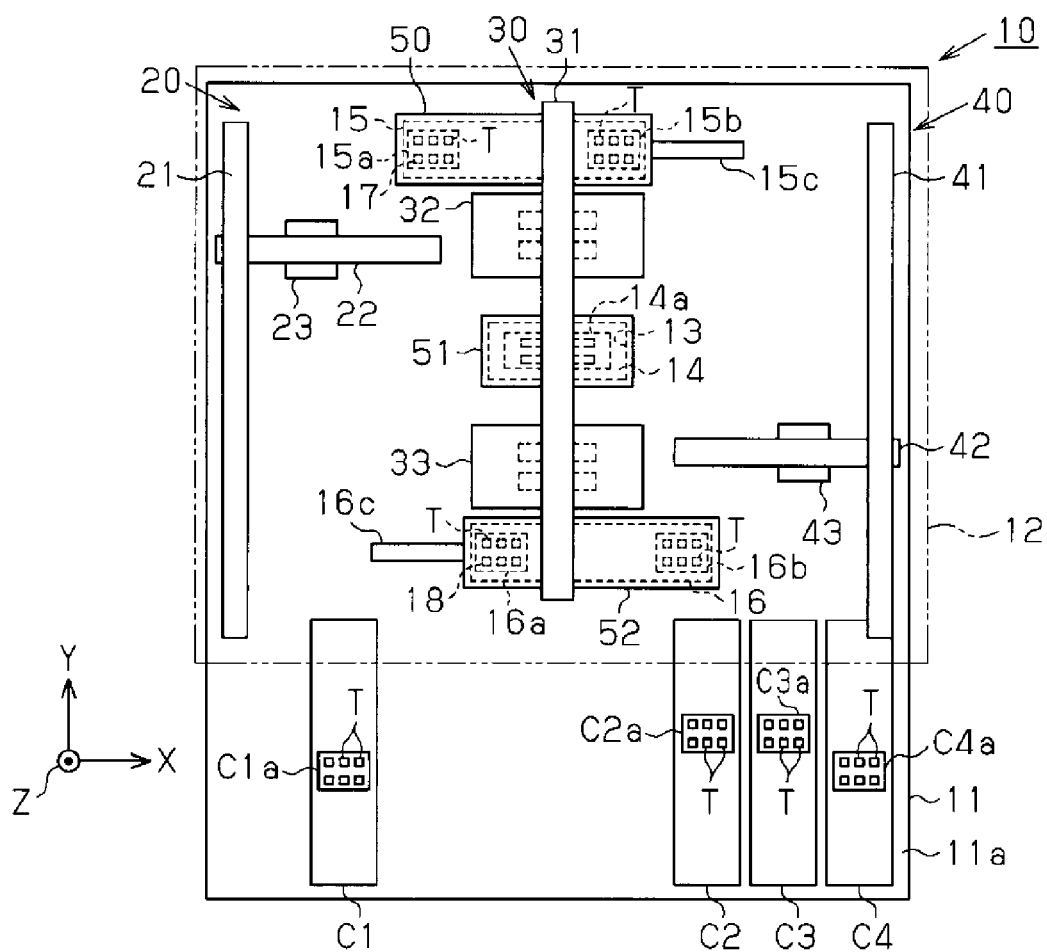
FIG. 1 illustrates the entire structure of a handler and a part inspecting apparatus according to an embodiment of the invention.

A handler and a part inspecting apparatus according to an embodiment of the invention are hereinafter described with reference to FIGS. 1 through 3. The part inspecting apparatus includes a handler for conveying electronic parts, and a tester provided separately from the handler for inspecting the electric characteristics of the electronic parts.

Structures of Handler and Part Inspecting Apparatus

The entire structures of the handler and the part inspecting apparatus including the handler are initially explained with reference to FIG. 1. As illustrated in FIG. 1, a carrying surface 11a corresponding to the top surface of a base 11 of a handler 10 is provided as a surface on which various types of robots are mounted. The major area of the carrying surface 11a is covered by a cover member 12. A conveyance space surrounded by the cover member 12 and the carrying surface 11a receives dry air from the outside to maintain predetermined humidity and temperature of the space.

Four conveyers C1 through C4 are arranged on the carrying surface 11a of the base 11 to convey electronic parts T between the outside and the inside of the cover member 12. The supplying conveyer C1 which conveys the electronic parts T before inspection from the outside to the inside of the cover member 12 is disposed on one side in an X direction corresponding to the direction where the respective conveyers are arranged. The receiving conveyers C2, C3, and C4 which convey the electronic parts T after inspection from the inside to the outside of the cover member 12 are disposed on the other side in the X direction. These conveyers C1 through C4 convey the plural electronic parts T contained in device trays C1a through C4a provided on the respective conveyers.

A rectangular opening 13 formed substantially at the center of the conveyance space is a hole penetrating the carrying surface 11a. A test head 14 of the tester is attached to the opening 13. An inspection socket 14a provided on the upper surface of the test head 14 to engage with the electronic parts T is electrically connected with an inspection circuit included in the tester for inspection of the attached electronic parts T. According to the structure of this tester, the test head 14 and the inspection socket 14a constitute one stage.

The carrying surface 11a carries a first shuttle 15 and a second shuttle 16 disposed on one and the other sides of the opening 13, respectively, in a Y direction perpendicular to the X direction, on which shuttles 15 and 16 the electronic parts T before and after inspection are temporarily placed. The shuttles 15 and 16 are extended in the X direction, and supplying shuttle plates 15a and 16a are fixed to the upper surfaces of the shuttles 15 and 16 on the side near the supplying conveyer C1. The supplying shuttle plates 15a and 16a have a plurality of housing pockets 17 and 18, respectively, within which the electronic parts T prior to inspection are housed. On the other hand, receiving shuttle plates 15b and 16b are fixed to the upper surfaces of the shuttles 15 and 16 on the side near the receiving conveyers C2 through C4, within which plates 15b and 16b the electronic parts T after inspection are housed. The shuttles 15 and 16 are respectively connected with shuttle guides 15c and 16c fixed to the carrying surface 11a and extended in the X direction so as to provide reciprocating movement in the X direction along the shuttle guides 15c and 16c. According to the structure of the handler 10, the first shuttle 15 and the supplying shuttle plate 15a constitute one stage, while the second shuttle 16 and the supplying shuttle plate 16a constitute another stage. FIG. 1 illustrates only a part of the housing pockets 17 and 18.

The carrying surface 11a of the base 11 further carries a robot mechanism which conveys the electronic parts T to each of the inspection socket 14a, the supplying shuttle plates 15a and 16a, and the receiving shuttle plates 15b and 16b. The shuttles 15 and 16 shift along the shuttle guides 15c and 16c in accordance with the actions of a supplying robot 20, a conveying robot 30, and a receiving robot 40 constituting the robot mechanism.

The supplying robot 20 disposed on the Y side of the supplying conveyer C1 conveys the electronic parts T prior to inspection from the device tray C1a on the supplying conveyer C1 to the supplying shuttle plates 15a and 16a on the shuttles 15 and 16. More specifically, the supplying robot 20 has a supplying side fixed guide 21 as a fixed shaft extended in the Y direction, a supplying side movable guide 22 connected with the supplying side fixed guide 21 in such a manner as to be reciprocatively movable in the Y direction, and a supplying hand unit 23 connected with the supplying side movable guide 22 in such a manner as to be reciprocatively movable in the X direction. A suction portion is provided at the lower end of the supplying hand unit 23 to suck the electronic parts T. The supplying hand unit 23 is joined to the supplying side movable guide 22 in such a manner as to be movable downward and upward in the direction of coming close to and away from the carrying surface 11a. The electronic parts T placed on the device tray C1a are sucked to the suction portion of the supplying hand unit 23 and conveyed in accordance with shifts of the supplying side movable guide 22 and the supplying hand unit 23 to be placed on the supplying shuttle plates 15a and 16a.

The receiving robot 40 disposed on the Y side of the receiving conveyers C2 through C4 conveys the electronic parts T after inspection from the receiving shuttle plates 15b and 16b on the shuttles 15 and 16 to the device trays C2a through C4a on the receiving conveyers C2 through C4. More specifically, the receiving robot 40 has a receiving side fixed guide 41 as a fixed shaft extended in the Y direction, a receiving side movable guide 42 connected with the receiving side fixed guide 41 in such a manner as to be reciprocatively movable in the Y direction, and a receiving hand unit 43 connected with the receiving side movable guide 42 in such a manner as to be reciprocatively movable in the X direction similarly to the supplying robot 20. A suction portion is provided at the lower end of the receiving hand unit 43 to suck the electronic parts T. The receiving hand unit 43 is joined to the receiving side movable guide 42 in such a manner as to be movable downward and upward in the direction of coming close to and away from the carrying surface 11a. The electronic parts T placed on the receiving shuttle plates 15b and 16b are sucked to the suction portion of the receiving hand unit 43 and conveyed in accordance with shifts of the receiving side movable guide 42 and the receiving hand unit 43 to be placed on the device trays C2a through C4a.

The conveying robot 30 has a conveying guide 31 as a fixed shaft disposed substantially at the center of the conveyance space and extended in the Y direction, and a first conveying unit 32 and a second conveying unit 33 connected with the conveying guide 31 in such a manner as to be reciprocatively movable in the Y direction. The first conveying unit 32 reciprocates above and between the first shuttle 15 and the test head 14, while the second conveying unit 33 reciprocates above and between the second shuttle 16 and the test head 14. A suction portion is provided at each lower end of the first conveying unit 32 and the second conveying unit 33 to suck the electronic parts T. The first conveying unit 32 and the second conveying unit 33 are connected with the conveying guide 31 in such a manner as to be movable downward and upward in the direction of coming close to and away from the carrying surface 11a.

The first conveying unit 32 sucks the electronic parts T prior to inspection placed on the supplying shuttle plate 15a on the first shuttle 15 via the suction portion of the first conveying unit 32, and conveys and brings the electronic parts T into engagement with the inspection socket 14a of the test head 14 by a predetermined pressing force. A plurality of female terminals are concaved in the bottom surface of the inspection socket 14a to engage with male terminals of the electronic parts T. Under the condition of engagement between the male terminals of the electronic parts T and the female terminals of the inspection socket 14a, the tester can carry out inspection of the electric characteristics of the electronic parts T. The tester initiates inspection of the electronic parts T in response to an instruction of inspection start received from the handler 10, and outputs the inspection result and a signal indicating the end of inspection to the handler 10. When the inspection of the electronic parts T ends, the first conveying unit 32 conveys the electronic parts T after inspection from the inspection socket 14a of the test head 14 to the receiving shuttle plate 15b on the first shuttle 15.

Similarly, the second conveying unit 33 sucks the electronic parts T prior to inspection placed on the supplying shuttle plate 16a on the second shuttle 16 via the suction portion of the second conveying unit 33, and conveys and brings the electronic parts T into engagement with the inspection socket 14a of the test head 14 by a predetermined pressing force. When the tester finishes inspection of the electronic parts T, the second conveying unit 33 conveys the electronic parts T after inspection from the inspection socket 14a of the test head 14 to the receiving shuttle plate 16b on the second shuttle 16. The actions of the first conveying unit 32 and the second conveying unit 33 for conveying the electronic parts T toward the test head 14 in this manner are alternately carried out so that the tester can sequentially execute inspection of the electronic parts T.

Each of the supplying hand unit 23, the receiving hand unit 43, and the first and second conveying units 32 and 33 simultaneously sucks and holds a plurality of electronic parts. Each of the suction portions of the respective units 23, 43, 32, and 33 is provided as an end effector capable of sucking and holding the electronic parts T by vacuum suction, for example.

According to this embodiment, a housing box 50 is provided around the first shuttle 15 as a housing vessel which has an isolated chamber within the conveyance space to contain the first shuttle 15, the supplying shuttle plate 15a, and the receiving shuttle plate 15b. Similarly, an inspection box 51 is provided around the opening 13 and the test head 14 attached to the opening 13 as a housing vessel which has an isolated chamber within the conveyance space to contain the test head 14 and the inspection socket 14a. Furthermore, a housing box 52 is provided around the second shuttle 16 as a housing vessel which has an isolated chamber within the conveyance space to contain the second shuttle 16, the supplying shuttle plate 16a, and the receiving shuttle plate 16b. Cooling for the electronic parts T is carried out for each of the housing box 50, the inspection box 51, and the housing box 52.

Structure of Cooling Unit

The structure of a cooling unit for cooling the electronic parts T is now explained with reference to FIG. 2. The part inspecting apparatus includes cooling units for cooling the electronic parts T contained in the housing pockets 17 and 18 of the supplying shuttle plates 15a and 16a, and a cooling unit for cooling the electronic parts T contained in the inspection socket 14a of the test head 14. In this embodiment, the cooling unit for cooling the electronic parts T contained in the housing pockets 17 on the supplying shuttle plate 15a is discussed as an example.

Figure 2:
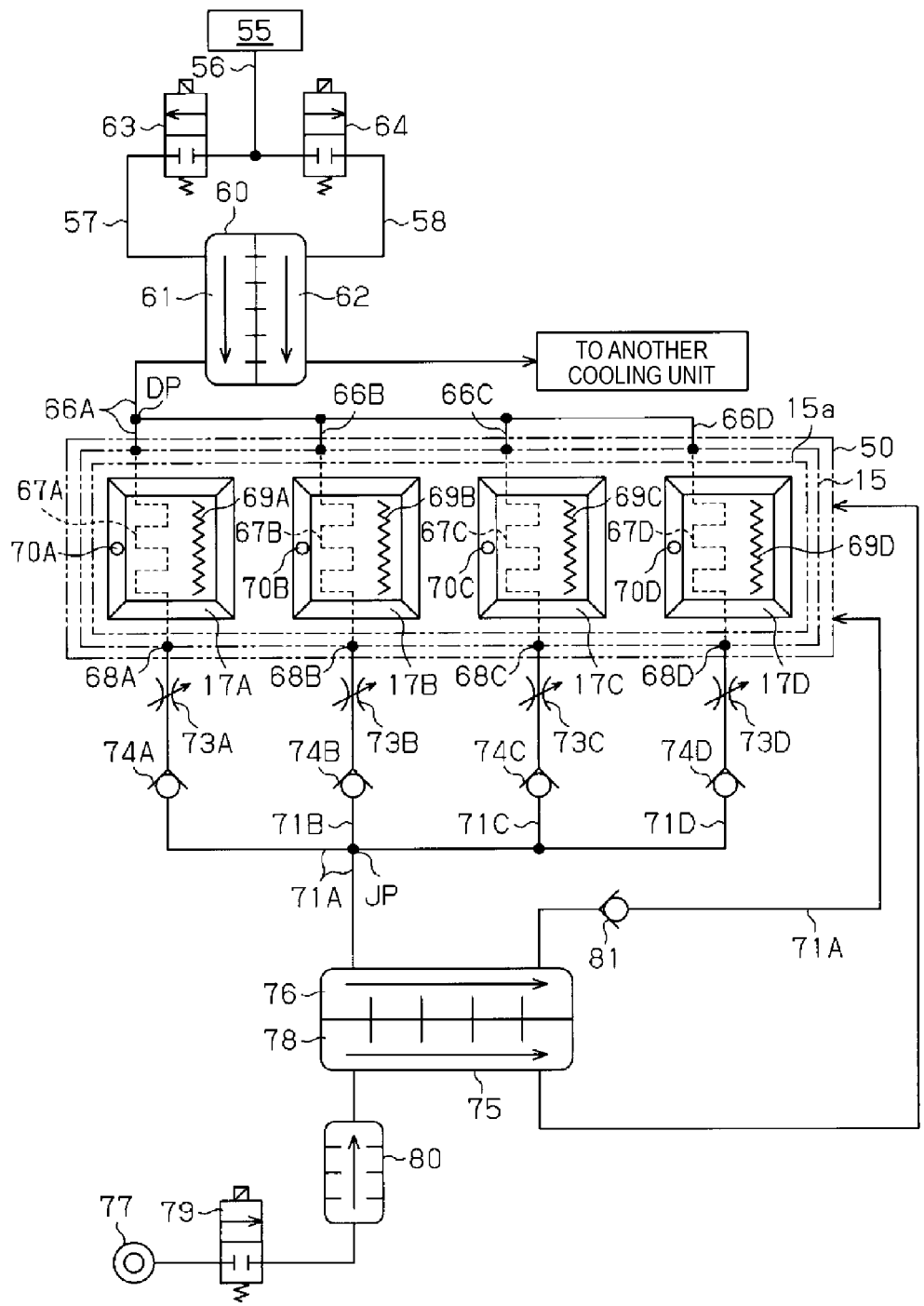
FIG. 2 schematically illustrates the general structure of a cooling unit according to the embodiment.

As illustrated in FIG. 2, one cooling unit cools the electronic parts T contained in four housing pockets of a housing pocket 17A corresponding to a first support portion, and housing pockets 17B, 17C, and 17D corresponding to second support portions of the plural housing pockets 17 provided on the supplying shuttle plate 15a. The cooling unit cools the respective housing pockets 17A through 17D such that the temperatures of the housing pockets 17A through 17D become a target temperature of −45° C., for example.

According to the structure of the cooling unit, a storage tank 55 constituting a refrigerant supply unit stores refrigerant of liquid nitrogen in the liquid phase. The storage tank 55 connects with a first connection channel 57 and a second connection channel 58 constituting a refrigerant supply unit via a common channel 56. The first and second connection channels 57 and 58 are pipes each of which has a continuous and substantially uniform cross-sectional area of the flow path. The first connection channel 57 is connected with a first vaporization chamber 61 of a heat exchanger 60, while the second connection channel 58 is connected with a second vaporization chamber 62 of the heat exchanger 60. A supply valve 63 (hereinafter abbreviated as a valve 63) is included in the first connection channel 57 to control the supply amount of liquid nitrogen to the first vaporization chamber 61 by opening and closing the first connection channel 57. Similarly, a supply valve 64 is included in the second connection channel 58 to control the supply amount of liquid nitrogen to the second vaporization chamber 62 by opening and closing the second connection channel 58.

The heat exchanger 60 is a so-called plate-type heat exchanger capable of achieving heat exchange between fluid flowing in the first vaporization chamber 61 and fluid flowing in the second vaporization chamber 62. The first and second connection channels 57 and 58 are connected with the heat exchanger 60 in such a manner that the fluids coming from the respective channels 57 and 58 flow in parallel with each other in the heat exchanger 60. The first and second vaporization chambers 61 and 62 have larger cross-sectional areas of the flow paths than those areas of the first and second connection channels 57 and 58, respectively. The liquid nitrogen having entered the first and second vaporization chambers 61 and 62 is vaporized and expanded within the vaporization vessel having a higher temperature than the boiling point of liquid nitrogen, and becomes nitrogen gas having a lower temperature than a set temperature of a control device determined as a target temperature. Then, the refrigerant changed into nitrogen gas in the first vaporization chamber 61 is supplied to a first supply channel 66A of the cooling unit, while the refrigerant changed into nitrogen gas in the second vaporization chamber 62 is supplied to a first supply channel of another cooling unit.

The first supply channel 66A connects with a first cooling channel 67A formed in the first shuttle 15 in such a position as to pass immediately below the housing pocket 17A. Moreover, the first supply channel 66A connects with three second supply channels 66B, 66C, and 66D in parallel, which are branched at a divergence point DP of the first supply channel 66A. The second supply channels 66B, 66C and 66D are joined with second cooling channels 67B, 67C, and 67D formed in the first shuttle 15 in such positions as to pass immediately below the housing pockets 17B through 17D, respectively. In other words, the first cooling channel 67A and the second cooling channels 67B through 67D connect with each other in parallel.

Heating units 69A, 69B, 69C, and 69D (hereinafter abbreviated as heaters) are provided within the first shuttle 15 immediately below the housing pockets 17A through 17D, respectively. The heaters 69A through 69D heat the corresponding housing pockets 17A through 17D. Temperature sensors 70A, 70B, 70C, and 70D for detecting the temperatures of the housing pockets 17A through 17D are equipped on the housing pockets 17A through 17D. The temperatures of the housing pockets 17A through 17D are adjusted to the target temperature by both effects of cooling by the nitrogen gas flowing through the respective cooling channels 67A through 67D and heating by the heaters 69A through 69D.

On the other hand, a first discharge channel 71A connects with a discharge port 68A of the first cooling channel 67A. The first discharge channel 71A joins with the housing box 50 to introduce the nitrogen gas discharged from the first cooling channel 67A into the housing box 50. Moreover, second discharge channels 71B, 71C, and 71D each of which has substantially the same cross-sectional area of the flow path as that area of the first discharge channel 71A connect with discharge ports 68B, 68C, and 68D of the second cooling channels 67B through 67D. The second discharge channels 71B through 71D join with the first discharge channel 71 at a junction point JP between the first discharge channel 71A and the second discharge channels 71B through 71D to introduce the nitrogen gas discharged from the second cooling channels 67B through 67D into the first discharge channel 71A. This structure allows entrance of the nitrogen gas discharged from the respective cooling channels 67A through 67D into the housing box 50.

A first throttle valve 73A is included in the first discharge channel 71A on the upstream side with respect to the junction point JP to decrease the flow amount of nitrogen gas in the first cooling channel 67A by changing the cross-sectional area of the flow path of the first discharge channel 71A. Similarly, second throttle valves 73B, 73C, and 73D are included in the second discharge channels 71B through 71D, respectively, on the upstream side with respect to the junction point JP to decrease the flow amounts of nitrogen gas in the second supply channels 66B through 66D by changing the cross-sectional areas of the flow paths of the second discharge channels 71B through 71D.

In addition, a first non-return valve 74A is included in the first discharge channel 71A between the first throttle valve 73A and the junction point JP to prevent entrance of gas flowing through the first discharge channel 71A in the reverse direction into the first cooling channel 67A. Similarly, second non-return valves 74B, 74C, and 74D are included in the second discharge channel 71B through 71D, respectively, between the junction point JP and the second throttle valves 73B through 73D to prevent entrance of gas flowing through the second discharge channels 71B through 71D in the reverse direction into the second cooling channels 67B through 67D.

Furthermore, a heat exchanger 75 as a temperature raising unit for raising the temperature of nitrogen gas flowing through the first discharge channel 71A to a temperature around the room temperature is included in the first discharge channel 71A on the downstream side with respect to the junction point JP. The heat exchanger 75 is a so-called plate-type heat exchanger which allows nitrogen gas flowing through the first discharge channel 71A to enter a low-temperature fluid chamber 76, and allows dry air produced by a dry air supply source 77 to enter a high-temperature fluid chamber 78. These nitrogen gas and dry air flow in parallel with each other within the heat exchanger 75. The dry air supply source 77 is constituted by a compressor or a drier, for example. The amount of the dry air generated from the dry air supply source 77 and supplied to the heat exchanger 75 is controlled by a valve 79, while the temperature of the dry air is raised to a temperature higher than the room temperature by the use of an air heater 80. Then, the temperatures of the nitrogen gas and the dry air are adjusted to the room temperature by heat exchange therebetween in the heat exchanger 75, and the nitrogen gas and the dry air having the room temperature are guided into the housing box 50. The first discharge channel 71A further includes a third non-return valve 81 on the downstream side with respect to the heat exchanger 75 to prevent entrance of gas flowing through the first discharge channel 71A in the reverse direction into the low-temperature fluid chamber 76.

Electric Structures of Handler and Part Inspecting Apparatus

The electric structures of the handler and the part inspecting apparatus are now explained with reference to FIG. 3. In the following description, the electric structure of the handler 10 is chiefly discussed. A control device 85 constituting a controller of the handler 10 has a microcomputer as a main device which includes a central processing unit (CPU), a non-volatile memory (ROM), and a volatile memory (RAM). The control device 85 performs and supervises various controls associated with the handler 10 such as the actions of the robot mechanism including the supplying robot 20, the conveying robot 30, and the receiving robot 40 based on various data and programs stored in the ROM and RAM. The control device 85 electrically connects with a tester 90 to allow input and output of signals requesting the start and end of inspection of the electronic parts T from and to the tester 90. Explained herein is a control mode associated with the cooling unit for cooling the housing pockets 17A through 17D of the supplying shuttle plate 15a as an example of the controls performed by the control device 85.

Figure 3:
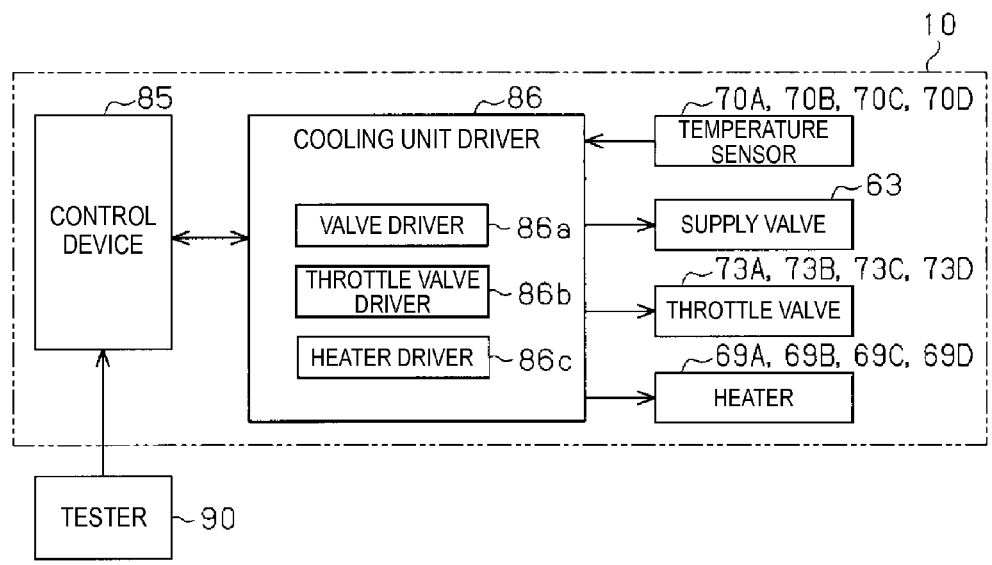
FIG. 3 is a block diagram showing a part of the electric structure of the handler according to the embodiment.

As illustrated in FIG. 3, a cooling unit driver 86 provided with a valve driver 86a, a throttle valve driver 86b, and a heater driver 86c is electrically connected with the control device 85.

The valve driver 86a determines the opening and closing time of the valve 63 such that a sufficient amount of nitrogen gas can be supplied to the first supply channel 66A for decreasing the temperatures of the four housing pockets 17A through 17D to the target temperature based on the deviation between the target temperature received from the control device 85 and the temperature received from the temperature sensor 70A, and outputs a signal indicating the determined opening and closing time to the valve 63. Moreover, the valve driver 86a outputs a signal instructing the valve 63 to maintain the close condition of the valve 63 when the detection value of the temperature sensor 70A is lower than a low-temperature allowable value Tmin lower than the target temperature. The valve 63 opens and closes in accordance with the received signals to control the flow amount of refrigerant in the first supply channel 66A.

The throttle valve driver 86b outputs an opening signal instructing the first throttle valve 73A to decrease the cross-sectional area of the flow path of the first discharge channel 71A. This opening signal indicates the opening determined in advance based on the target temperature received from the control device 85. Moreover, the throttle valve driver 86b outputs an opening signal instructing each of the second discharge channels 71B through 71D to set the cross-sectional area of the flow path of each of the second discharge channels 71B through 71D larger than the corresponding area of the first discharge channel 71A in response to the opening signal given to the first throttle valve 73A. According to this embodiment, the throttle valve driver 86b can output an opening signal indicating the maximum opening to each of the second throttle valves 73B through 73D.

The heater driver 86c generates driving current for each of the heaters 69A through 69D to adjust the respective temperatures of the housing pockets 17A through 17D to the target temperature based on the target temperature received from the control device 85 and the temperatures received from the respective temperature sensors 70A through 70D, and outputs the generated driving current to the respective heaters 69A through 69D to drive the heaters 69A through 69D.

The flow amount of the nitrogen gas in the first cooling channel 67A is decreased to an amount smaller than each flow amount of the nitrogen gas in the second cooling channels 67B through 67D by the function of the first throttle valve 73A. In this case, when the same driving power for maintaining the temperature of the housing pocket 17A at the target temperature is outputted to the heaters 69A and 69B under the condition in which the detection values of the temperature sensors 70A and 70B are both equivalent to the target temperature, for example, the temperature of the housing pocket 17B becomes lower than the target temperature. For overcoming this problem, the heater driver 86c in this embodiment can output larger driving power to each of the heaters 69B through 69D than the driving power to the heater 69A even when the deviation between the temperatures received from the temperature sensors 70B through 70D and the target temperature received from the control device 85 is the same as the deviation between the temperature received from the temperature sensor 70A and the target temperature.

Furthermore, when the temperature detected by any of the temperature sensors 70A through 70D is higher than a high-temperature allowable value Tmax higher than the target temperature, the heater driver 86c stops the heater 69A, 69B, 69C or 69D corresponding to this temperature sensor 70A, 70B, 70C, or 70D so as to promote cooling for the corresponding housing pocket 17.

Similarly to the cooling unit driver 86, a cooling unit driver is provided for each of the cooling units for the other housing pockets 17 on the supplying shuttle plate 15a, the housing pockets 18 on the supplying shuttle plate 16a, and the inspection socket 14a of the test head 14. In other words, the control device 85 controls the respective cooling units as independent units.

Operation

The operations of the handler and the part inspecting apparatus according to this embodiment are now explained.

According to the handler and the part inspecting apparatus in this embodiment, liquid nitrogen supplied from the storage tank 55 to the first connection channel 57 in the cooling unit flows into the first vaporization chamber 61 of the heat exchanger 60 in the course of flow. The liquid nitrogen having entered the first vaporization camber 61 is vaporized and expanded within the vaporization vessel having a temperature higher than the boiling point of liquid nitrogen, and changes into nitrogen gas. The nitrogen gas thus produced flows into the first supply channel 66A.

The nitrogen gas having entered the first supply channel 66A is branched into parts flowing through the first supply channel 66A and the second supply channels 66B through 66D at the divergence point DP. In this case, the flow amount of the nitrogen gas in the first cooling channel 67A is set at a small amount by the opening control of the first throttle valve 73A in accordance with the target temperature. On the other hand, the openings of the second throttle valves 73B through 73D for the second cooling channels 67B through 67D are constantly set larger than the opening of the first throttle valve 73A so that each of the flow amounts of the nitrogen gas in the second cooling channels 67B through 67D can be larger than that amount in the first cooling channel 67A. As a consequence, each of the flow amounts of the nitrogen gas in the second cooling channels 67B through 67D becomes larger than the amount of the nitrogen gas in the first cooling channel 67A, in which condition the housing pockets 17B through 17D are cooled more excessively for the target temperature than the housing pocket 17A.

Then, the control device 85 controls the opening and closing condition of the valve 63 and the driving power outputted to the heater 69A such that the temperature of the housing pocket 17A received from the temperature sensor 70A becomes the target temperature. Also, the control device 85 controls the driving power outputted to the heaters 69B through 69D such that the temperatures of the housing pockets 17B through 17D received from the temperature sensors 70B through 70D become the target temperature. That is, the control device 85 outputs larger driving power to the respective heaters 69B through 69D than the driving power for the heater 69A. As a result, the temperatures of the housing pockets 17A through 17D are adjusted to the target temperature, in which condition the temperatures of the electronic parts T contained in the housing pockets 17A through 17D become the target temperature under this control.

Figure 4:
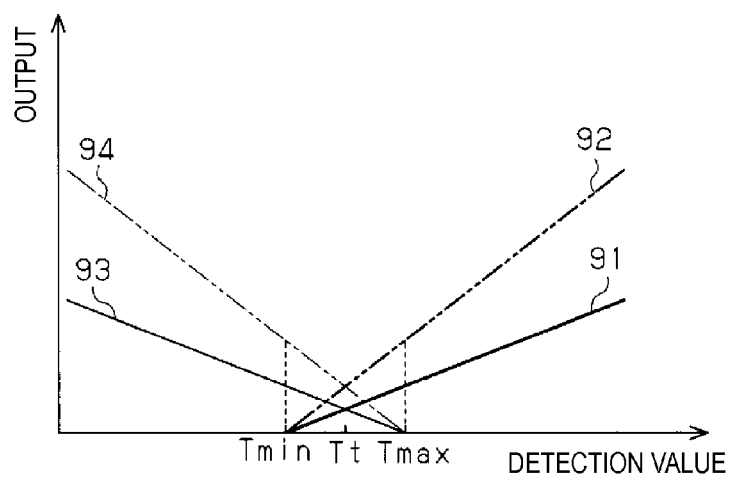
FIG. 4 is a graph showing an example of the relationship between detection values of temperature sensors and cooling and heating outputs for housing pockets in the handler according to the embodiment.

More specifically, as illustrated in FIG. 4, this structure produces a pseudo-condition in which the housing pockets 17B through 17D are cooled under a higher cooling output 92 than a cooling output 91 given to the housing pocket 17A, and heated under a higher heating output 94 than a heating output 93 given to the housing pocket 17A. In this case, when the temperatures detected by the temperature sensors 70A and 70B are equivalent to each other and higher than the high-temperature allowable value Tmax, for example, the temperature of the housing pocket 17B reaches a target temperature Tt more rapidly than that of the housing pocket 17A under the condition in which the cooling output 92 to the housing pocket 17B is higher than the cooling output 91 to the housing pocket 17A. In other words, the housing pockets 17B through 17D respond to cooling more easily than the housing pocket 17A.

On the other hand, when the temperature sensors 70A and 70B are equivalent to each other and lower than the low temperature allowable value Tmin, the temperature of the housing pocket 17B reaches the target temperature Tt in an earlier period than the temperature of the housing pocket 17A under the condition in which the heating output 94 to the housing pocket 17B is higher than the heating output 93 to the housing pocket 17A. In other words, the housing pockets 17B through 17 respond to heating more easily than the housing pocket 17A.

The nitrogen gas discharged from the respective cooling channels 67A through 67D flows into the low-temperature fluid chamber 76 of the heat exchanger 75 through the first discharge channel 71A. Moreover, dry air whose temperature has been raised to a temperature higher than the room temperature by the function of the air heater 80 flows into the high-temperature fluid chamber 78 of the heat exchanger 75. The temperature of the nitrogen gas having entered the heat exchanger 75 is raised to a temperature around the room temperature by heat exchange with the dry air in the heat exchanger 75, and flows into the housing box 50. On the other hand, the dry air is cooled to a temperature around the room temperature by heat exchange with the nitrogen gas, and enters the housing box 50.

The nitrogen gas is produced by vaporization of liquid nitrogen, and therefore contains an amount close to zero of water. Moreover, the dry air contains a smaller amount of water than that of air around the handler 10. In this case, the housing box 50 receiving these nitrogen gas and dry air is filled with gas containing a small amount of water, wherefore dew condensation on the housing box 50 can be reduced. Accordingly, failures of the electronic parts T caused by dew condensation on the supplying shuttle plate 15*a* and the electronic parts T housed in the supplying shuttle plate 15*a* can be avoided.

When the housing box 50 is filled with the nitrogen gas and the dry air, these gases accommodated within the housing box 50 contain an amount of water larger than zero. In this case, when the nitrogen gas discharged from the respective cooling channels is introduced into the housing box 50 without rise of the temperature of the nitrogen gas, there is a possibility that the temperature of the interior of the housing box 50 becomes the dew point or lower at that time. According to this embodiment, however, the nitrogen gas whose temperature has been raised to a temperature around the room temperature by the use of the heat exchanger 75 enters the housing box 50. In this case, the temperature of the interior of the housing box 50 is difficult to become the dew point or lower at that time. Accordingly, even in the case of the receiving shuttle plate 15*b* having a higher temperature than that of the supplying shuttle plate 15*a*, failures of the electronic parts T caused by dew condensation on the receiving shuttle plate 15*b* and the electronic parts T contained in the receiving shuttle plate 15*b* can be also prevented.

The nitrogen gas cooling the respective housing pockets 17A through 17D and the dry air raising the temperature of the nitrogen gas to a temperature around the room temperature are used for avoiding dew condensation on the housing box 50. This structure can simplify the structure of the cooling unit and reduce the amount of gas to be used when compared with a structure which uses additional gas for avoiding dew condensation.

The first non-return valve 74A is included in the first discharge channel 71A on the upstream side with respect to the junction point JP, while the second non-return valves 74B through 74D are included in the second discharge channels 71A through 71D on the upstream side with respect to the junction point JP. This structure can prevent flow of the nitrogen gas discharged from the second cooling channel 67B and passing through the first discharge channel 71A in the reverse direction to enter the first cooling channel 67A, for example, and flow of the nitrogen gas discharged from the second cooling channel 67B and passing through the second discharge channel 71C in the reverse direction to enter the second cooling channel 67C, for example. In this case, the nitrogen gas having a high temperature after passing through the second cooling channels 67B through 67D does not enter the first cooling channel 67A, contributing to effective cooling for the housing pocket 17A by the nitrogen gas supplied to the first cooling channel 67A. Moreover, the nitrogen gas having passed through other cooling channels does not flow into the second cooling channels 67B through 67D. This structure therefore achieves effective cooling for the respective housing pockets 17B through 17D, while maintaining the condition of excessive cooling for decreasing the temperatures of the respective housing pockets 17B through 17D to temperatures lower than the target temperature.

In addition, the third non-return valve 81 is included in the first discharge channel 71A on the downstream side with respect to the heat exchanger 75. This structure can prevent flow of gas containing a larger amount of water than that of the nitrogen gas from the housing box 50 into the heat exchanger 75, the first cooling channel 67A, the second cooling channels 67B through 67D, and the heat exchanger 60 through the first discharge channel 71A during the close condition of the valve 63. In addition, the flow of this gas into the first cooling channel 67A, the second cooling channels 67B through 67D, and the heat exchanger 60 can also be prevented by the functions of the first non-return valve 74A and the second non-return valves 74B through 74D. Accordingly, dew condensation on the flow passages of refrigerant such as the heat exchanger 75, the respective cooling channels 67A through 67D, and the heat exchanger 60 can be prevented when the valve 63 is again opened.

The handler and the part inspecting apparatus according to this embodiment described herein can offer the following advantages.

(1) Nitrogen gas is supplied from the first supply channel 66A to the first cooling channel 67A, and from the second supply channels 66B through 66D branched from the first supply channel 66A to the second cooling channels 67B through 67D for adjusting the temperatures of the four housing pockets 17A through 17D to the target temperature. Moreover, the first throttle valve 73A decreases the flow amount of nitrogen gas in the first cooling channel 67A to set each of the flow amounts of nitrogen gas in the second cooling channels 67B through 67D larger than the amount of nitrogen gas in the first cooling channel 67A. The opening and closing of the valve 63 and the output of the heater 69A are controlled such that the temperature of the housing pocket 17A detected by the temperature sensor 70A becomes the target temperature, while only the outputs of the heaters 69B through 69D are controlled such that the temperatures of the housing pockets 17B through 17D detected by the temperature sensors 70B through 70D become the target temperature. According to this structure, the cooling circuit provided for cooling the housing pockets 17A through 17D can be simplified, and the load on the control device 85 for adjusting the temperatures of the housing pockets 17A through 17D to the target temperature can be lowered.

(2) The first throttle valve 73A decreases the flow amount of nitrogen gas in the first cooling channel 67A. In this case, the flow amount of nitrogen gas in the first cooling channel 67A can be set smaller than each of the flow amounts of nitrogen gas in the second cooling channels 67B through 67D even when the cross-sectional area of the flow path of the first cooling channel 67A is larger than each of the cross-sectional areas of the flow paths of the second cooling channels 67B through 67D. Accordingly, the degree of freedom in designing the shapes and sizes of the first cooling channel 67A and the second cooling channels 67B through 67D becomes higher than that degree of a structure which does not have the first throttle valve 73A.

(3) Each of the cooling outputs for the housing pockets 17B through 17D is higher than the cooling output for the housing 17A. Thus, the housing pockets 17B through 17D can respond to cooling more easily than the housing pocket 17A.

(4) Each of the heating outputs for the housing pockets 17B through 17D is higher than the cooling output for the housing 17A. Thus, the housing pockets 17B through 17D can respond to heating more easily than the housing pocket 17A.

(5) Nitrogen gas used for cooling the housing pockets 17A through 17D is introduced into the housing box 50. In this case, the amount of water contained in the gas accommodated within the housing box 50 decreases. Accordingly, dew condensation within the housing box 50 can be reduced.

(6) The first non-return valve 74A is included in the first discharge channel 71A on the upstream side with respect to the junction point JP between the first discharge channel 71A and the second discharge channels 71B and 71D. This structure can effectively cool the housing pocket 17A by using the nitrogen gas supplied to the first cooling channel 67A.

(7) The second non-return valves 74B through 74D are included in the second discharge channels 71B through 71D on the upstream side with respect to the junction point JP between the first discharge channel 71A and the second discharge channels 71B and 71D. This structure can effectively cool the housing pockets 17B through 17D by using the nitrogen gas supplied to the second cooling channels 67B through 67D.

(8) The first non-return valve 74A and the second non-return valves 74B through 74D prevent flow of gas other than nitrogen gas from the respective supply channels into the respective cooling channels through the housing box 50. Thus, dew condensation in the respective cooling channels decreases.

(9) The second discharge channels 71B through 71D are connected with the first discharge channel 71A. This structure contributes to simplification of the cooling circuit.

(10) The first discharge channel 71A includes the heat exchanger 75 which raises the temperature of the nitrogen gas discharged from the first cooling channel 67A and the second cooling channels 67B through 67D to a temperature around the room temperature. In this case, the temperature of the interior of the housing box 50 does not become a temperature lower than the dew point. Thus, dew condensation within the housing box 50 decreases.

(11) Nitrogen gas cooling the housing pockets 17A through 17D and dry air raising the temperature of the nitrogen gas to a temperature around the room temperature are used for avoiding dew condensation on the housing box 50. This structure reduces the amount of gas to be used for preventing dew condensation on the housing box 50.

(12) The third non-return valve 81 is disposed on the downstream side with respect to the heat exchanger 75. Accordingly, dew condensation on the heat exchanger 60, the first cooling channel 67A, the second cooling channels 67B through 67D, and the heat exchanger 75 can be avoided.

(13) The first discharge channel 71A includes the heat exchanger 75 on the downstream side with respect to the junction point JP between the first discharge channel 71A and the second discharge channels 71B through 71D. Thus, the number of the heat exchanger 75 can be decreased smaller than that number of a structure which includes the heat exchanger 75 for each of the discharge channels 71A through 71D.

(14) Nitrogen gas and dry air flow in parallel with each other in the heat exchanger 75. This structure can decrease the temperature difference between nitrogen gas and dry air immediately after their passing through the heat exchanger 75 when compared with a structure which allows nitrogen gas and dry air to flow opposed to each other in the heat exchanger 75. Thus, the temperature distribution of the housing box 50 receiving the nitrogen gas and the dry air can be equalized.

According to this embodiment, the following modifications may be made where appropriate.

The control device 85 is only required to control the opening of the first throttle valve 73A and the openings of the second throttle valves 73B through 73D such that each of the flow amounts of refrigerant in the second cooling channels 67B through 67D becomes larger than the flow amount of refrigerant in the first cooling channel 67A.

For example, when the flow amounts of refrigerant in the second cooling channels 67B through 67D are different from each other, the control device 85 may detect these variations based on the detection values of the temperature sensors 70B through 70D and the levels of the driving power given to the heaters 69B through 69D, and control the respective openings of the second throttle valves 73B through 73D in accordance with the variations. According to this structure, the flow amounts of refrigerant flowing through the second cooling channels 67B through 67D can be equalized.

Moreover, the flow amount of refrigerant in the second cooling channel 67B, for example, may be set larger than the flow amount of each of the other second cooling channels 67C and 67D, while maintaining the condition in which each of the flow amounts of refrigerant in the second cooling channels 67B through 67D is larger than the flow amount of refrigerant in the first cooling channel 67A. In this case, the target temperature of the housing pocket 17B can be set to a temperature lower than the target temperatures of the housing pockets 17A and the housing pockets 17C and 17D. In other words, the degree of freedom in determination of the target temperatures of the housing pockets 17B through 17D increases within the range of temperatures lower than the target temperature of the housing pocket 17A.

The opening of the first throttle valve 73A and the openings of the second throttle valves 73B through 73D may be controlled beforehand such that each of the flow amounts of refrigerant in the second cooling channels 67B through 67D is larger than the flow amount in the first cooling channel 67A. This structure can eliminate the throttle valve driver 86b of the control device 85, thereby further reducing the load on the control device 85.

The second throttle valves 73B through 73D may be eliminated. This structure can further simplify the cooling circuit, and reduce the load on the control device 85.

The heat exchanger 75 for raising the temperature of the nitrogen gas discharged from the respective cooling channels 67A through 67D may be eliminated. In this case, the temperature of the interior of the housing box 50 decreases, but dew condensation within the housing box 50 can be reduced by introduction of the nitrogen gas containing an amount close to zero of water into the housing box 50.

The heat exchanger 75 may connect with each of the discharge channels 71A through 71D on the upstream side with respect to the junction point JP between the first discharge channel 71A and the second discharge channels 71B through 71D.

The temperature of the refrigerant discharged from the respective cooling channels 67A through 67D may be directly increased by an air heater or the like in place of the heat exchanger 75.

The respective discharge channels 71A through 71D may be separately connected to the housing box 50. In this case, it is preferable that the heat exchanger 75 and the third non-return valve 81 are provided for each of the discharge channels 71A through 71D.

The third non-return valve 81 included in the first discharge channel 71A may be eliminated. According to this structure, entrance of air flowing in the reverse direction in the respective discharge channels 71A through 71D into the respective cooling channels 67A through 67D and the heat exchanger 60 can be similarly prevented by the functions of the first non-return valve 74A in the first discharge channel 71A and the second non-return valves 74B through 74D in the second discharge channels 71A through 71D.

Either the first non-return valve 74A in the first discharge channel 71A or at least one of the second non-return valves 74B through 74D in the second discharge channels 71B through 71D may be eliminated. That is, at least one of the cooling channels 67A through 67D is only required to constantly communicate with the housing box 50.

The nitrogen gas flowing out of the respective cooling channels 67A through 67D may be discharged into the cover member 12 or the atmosphere other than the housing box 50.

According to this embodiment, the first cooling channel 67A and the second cooling channels 67B through 67D are provided on the first shuttle 15. However, such a structure is allowed which disposes the first cooling channel 67A and the second cooling channel 67B on the first shuttle 15 and the second cooling channels 67C and 67D on the second shuttle 16, for example. In this case, it is preferable that the nitrogen gas discharged from the second cooling channels 67C and 67D is introduced into the housing box 52.

Alternatively, such a structure is allowed which disposes the first cooling channel 67A and the second cooling channel 67B on the first shuttle 15, and the second cooling channels 67C and 67D on the test head 14. In this case, it is preferable that the nitrogen gas discharged from the second cooling channels 67C and 67D is introduced into the inspection box 51.

The control device 85 may increase the openings of the throttle valves 73A through 73D to the maximum openings until the time when the temperature detected by the temperature sensor 70A reaches the target temperature, and decreases the opening of the first throttle valve 73A after the temperature detected by the temperature sensor 70A becomes the target temperature during the cooling control for decreasing the temperatures of the respective housing pockets 17A through 17D from the room temperature to the target temperature. According to this structure, the time required for adjusting the temperatures of the housing pockets 17A through 17D from the room temperature to the target temperature can be shortened.

The control device 85 may control the valve 63 based on a predetermined opening and closing time corresponding to the target temperature, and control the opening of the first throttle valve 73A based on the detection value of the temperature sensor 70A as an example of controls associated with the flow amount of refrigerant flowing in the first cooling channel 67A.

The first throttle valve 73A included in the first supply channel 66A may be disposed on the downstream side with respect to the divergence point DP.

The flow amount of refrigerant in the first cooling channel 67A may be made smaller than each of the flow amounts in the second cooling channels 67B through 67D by partially or entirely decreasing the cross-sectional area of the flow path of the first supply channel 66A to an area smaller than the cross-sectional area of the flow path of each of the second supply channels 66B through 66D. This also applies to the portion of the first discharge channel 71A on the upstream side with respect to the junction point JP and the second discharge channels 71B through 71D.

The number of the second supply channels branched from the first supply channel is not limited to three but may be one, four or larger. In this case, it is preferable that a sufficient amount of refrigerant for cooling all of the housing pockets to a temperature lower than the target temperature is supplied from the refrigerant supply unit to the housing pockets.

The storage tank 55 may be provided outside the handler 10. In this case, a connection portion formed in the common channel 56 of the handler 10 to connect with piping joined with the storage tank 55 constitutes a part of the refrigerant supply unit.

Refrigerant for cooling the respective housing pockets is not limited to nitrogen but may be oxygen or helium. Alternatively, the refrigerant may be dry air cooled to a temperature lower than the target temperature by using nitrogen gas or the like.

According to this embodiment, the heaters 69B through 69D are driven by larger driving power than the driving power for the heater 69A. However, the heaters 69B through 69D may be driven by the same driving power as the driving power for the heater 69A, or by lower driving power than the driving power for the heater 69A in the range of the lower detection values of the temperature sensors 70B through 70D than the low-temperature allowable value Tmin, for example.

The flow amount of refrigerant in the first cooling channel 67A may be smaller than the flow amount of refrigerant in each of the second cooling channels 67B through 67D. According to this structure, the housing pocket 17A can respond to cooling and heating more easily than the housing pockets 17B through 17D.

The cooling unit may be constructed such that the flow amounts of refrigerant in the respective cooling channels 67A through 67D become substantially uniform. In this case, the first supply channel 66A can receive a sufficient amount of nitrogen gas for decreasing the temperatures of the four housing pockets 17A through 17D to the target temperature based on the target temperature and the detection value of the temperature sensor 70A. Thus, the temperatures of the housing pockets can be adjusted to the target temperature by the cooperative effects of the cooling by the refrigerant and the heating by the heaters even in the cooling unit having this structure. More specifically, the control device 85 controls the supply valve 63 and the heater 69A according to the detection value of the temperature sensor 70A, and controls only the outputs of the heaters 69B through 69D according to the detection values of the temperature sensors 70B through 70D so as to adjust the temperatures of the housing pockets 17A through 17 to the target temperature. This structure can eliminate the respective throttle valves 73A through 73D and the throttle valve driver 86b, thereby achieving further simplification of the cooling circuit and reduction of the load on the control device 85.

When the detection value of the temperature sensor 70B is a temperature Ta higher than the target temperature Tt, for example, it is preferable that the flow amount of refrigerant in the second cooling channel 67B is larger than the flow amount sufficient for maintaining the temperature of the housing pocket 17B at the target temperature Tt. On the other hand, when the detection value of the temperature sensor 70B is a temperature Tb lower than the target temperature Tt, it is preferable that the flow amount of refrigerant in the second cooling channel 67B is smaller than the flow amount sufficient for maintaining the temperature of the housing pocket 17B at the target temperature Tt.

According to the cooling unit constructed as above, however, the flow amount of refrigerant appropriate for maintaining the temperature of the housing pocket 17A at the target temperature Tt is supplied to the first cooling channel 67A of the housing pocket 17A when the detection value of the temperature sensor 70A is the target temperature Tt. In this case, the flow amount of refrigerant appropriate for maintaining the temperature of the housing pocket 17B at the target temperature Tt is similarly supplied to the second cooling channel 67B regardless of the detection value of the temperature sensor 70B.

Therefore, under the condition of the detection value of the temperature sensor 70A equivalent to the target temperature Tt and the detection value of the temperature sensor 70B equivalent to the temperature Ta higher than the target temperature Tt, the housing pocket 17B responds to cooling more slowly when the driving power for the heater 69B is the same as the driving power for the heater 69A given at the time of the temperature Ta as the detection value of the temperature sensor 70A. Also, under the condition of the detection value of the temperature sensor 70A equivalent to the target temperature Tt and the detection value of the temperature sensor 70B equivalent to the temperature Tb lower than the target temperature Tt, the housing pocket 17B responds to heating more slowly when the driving power for the heater 69B is the same as the driving power for the heater 69A given at the time of the temperature Ta as the detection value of the temperature sensor 70A.

Accordingly, it is preferable that the control device 85 of the cooling unit constructed as above can set the driving power for the heaters 69B through 69D at predetermined temperatures to driving power different from the driving power for the heater 69A at the same predetermined temperature based on the deviation between the detection value of the temperature sensor 70A and the detection values of the temperature sensors 70B through 70D, for example.

Figure 5A:
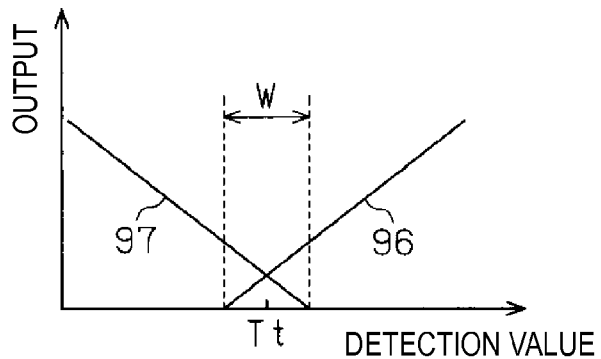
FIGS. 5A through 5D are graphs showing an example of the relationship between detection values of temperature sensors and cooling and heating outputs for housing pockets in modified examples.

According to the cooling unit constructed as above, an overlap range W where both a cooling output 96 and a heating output 97 are given for adjustment to the target temperature Tt as illustrated in FIG. 5A may be varied.

Figure 5B:
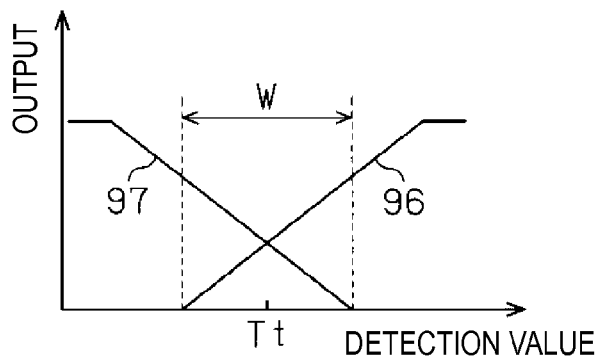

More specifically, when the overlap range W for adjustment to the target temperature Tt is widened as illustrated in FIG. 5B, the cooling output 96 and the heating output 97 required for adjusting the temperature of the housing pocket to the target temperature increase. In this case, when the temperature of the housing pocket maintained at the target temperature rises, for example, the housing pocket can be cooled under a high cooling output. Thus, the housing pocket can respond to cooling more easily. On the other hand, when the temperature of the housing pocket maintained at the target temperature drops, for example, the housing pocket can be heated under a high heating output. Thus, the housing pocket can respond to heating more easily. Accordingly, the respective housing pockets can respond to cooling and heating more easily as the overlap range W widens, improving the accuracy of adjustment of the temperatures of the housing pockets to the target temperature.

Figure 5C:
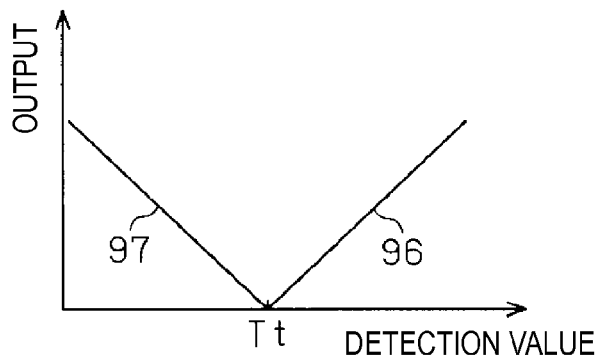
Figure 5D:
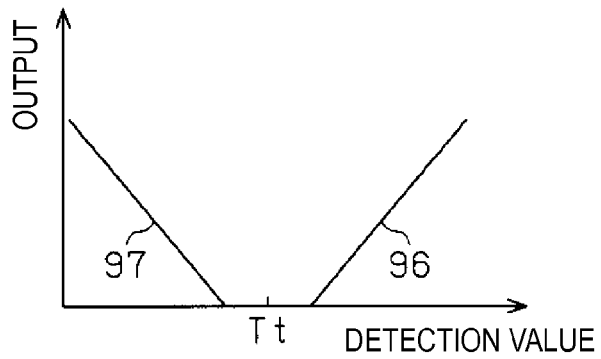

Alternatively, the overlap range W for adjustment of the target temperature Tt may be set to zero as illustrated in FIG. 5C. Furthermore, the overlap range W may be set to a value below zero, that is, a dead band where neither of the cooling output 96 and the heating output 97 is given may be established as illustrated in FIG. 5D. According to this structure, the consumption of the refrigerant and the consumption of the power for the heaters for the adjustment of the temperatures of the housing pockets to the target temperature can be reduced.

Figure 6:
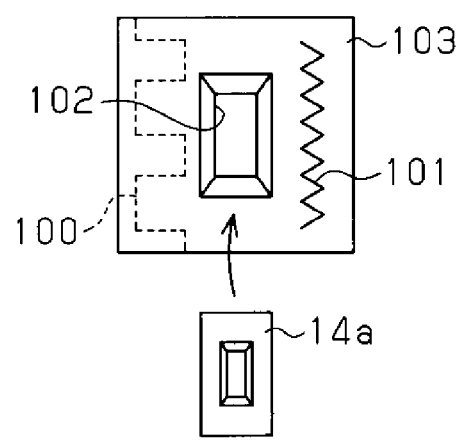
FIG. 6 schematically illustrates a support portion in a modified example.

According to this embodiment, the stage is constituted by the test head 14 attached to the opening 13 penetrating the base 11, and the inspection socket 14*a* provided on the upper surface of the test head 14. However, as illustrated in FIG. 6, the stage may be constituted by a pedestal 103 disposed on the base 11 and including a cooling channel 100 through which nitrogen gas flows, a heating unit 101, and a housing portion 102 accommodating the inspection socket 14*a*. In this case, the pedestal 103 corresponds to the support portion, and the inspection socket 14*a* is mounted on the handler 10 when accommodated in the housing portion 102 of the pedestal 103. According to this structure, the electronic parts contained in the inspection socket 14*a* can be cooled by cooling the pedestal 103.

The handler and the tester included in the part inspecting apparatus are separate units. Thus, when the test head 14 and the inspection socket 14*a* constitute a stage, the test head 14 of the tester requires a channel for flow of nitrogen gas and a heater beforehand separately from the structure of the handler. According to the structure described herein, however, the electronic parts T contained in the inspection socket 14*a* can be cooled without the use of the test head 14 provided with the inner channel and the heater.

The temperature sensor may be mounted either on the pedestal 103 or on the inspection socket 14*a* as long as the temperature sensor can detect the temperature of the inspection socket 14*a*. According to the example shown in FIG. 6, the pedestal 103 has the one housing portion 102. However, the number of the housing portion 102 provided on the pedestal 103 may be two or a larger number. The test head 14 and the inspection socket 14*a* may be contained in the housing portion 102 of the pedestal 103. In brief, the structure is only required to cool a component in indirect contact with the electronic parts with a heat conductive member provided between the electronic parts and this component which corresponds to a support portion for supporting the electronic parts. When the plural housing portions 102 are provided on the pedestal 103, it is preferable that the pedestal 103 has the cooling channels 100 equipped for each of the housing portions 102.

The support portion may be arbitrarily determined as long as the support portion is a portion disposed on the carrying surface 11*a* of the base 11 or at a position above the base 11 within the conveyance space covered by the cover member 12 to support the electronic parts T. For example, the supplying shuttle plate 15*a* and the receiving shuttle plate 15*b* may be determined as separate stages, for each of which a cooling unit is provided to cool the corresponding stage. Alternatively, a stage may be provided on the suction portion at the lower end of each of the first conveying unit 32 and the second conveying unit 33, and a cooling unit may be equipped at the lower end of each of the first conveying unit 32 and the second conveying unit 33. In other words, a cooling unit may be provided for a support portion formed at any portion for supporting the electronic parts T. In this case, transfer of the electronic parts T between the respective cooling units is achieved through partial opening and closing of each housing vessel.

The entire disclosure of Japanese Patent Application No. 2012-029179, filed Feb. 14, 2012 is expressly incorporated by reference herein.

What is claimed is:

1. A handler, comprising:
   a first cooling channel through which refrigerant passes to cool a first support portion provided to support a part;
   a second cooling channel through which refrigerant passes to cool a second support portion different from the first support portion and provided to support a part;
   a first heater provided to heat the first support portion;
   a second heater different from the first heater and provided to heat the second support portion;
   a first temperature sensor provided to detect the temperature of the first support portion;
   a second temperature sensor different from the first temperature sensor and provided to detect the temperature of the second support portion; and
   a refrigerant supply unit which supplies refrigerant to the first cooling channel and the second cooling channel via a flow amount control valve,
      the first cooling channel and the second cooling channel being connected with the refrigerant supply unit in parallel, and
      the handler further including a controller which varies the opening and closing of the flow amount control valve and the output of the first heater based on a temperature value detected by the first temperature sensor, and varies the output of the second heater based on a temperature value detected by the second temperature sensor.

2. The handler according to claim 1, wherein the first cooling channel has a flow path through which a smaller amount of refrigerant flows than the flow amount of refrigerant flowing in the second cooling channel.

3. The handler according to claim 1, further comprising a throttle valve which decreases the flow amount of refrigerant in the first cooling channel.

4. The handler according to claim 1, further comprising:
a housing vessel which accommodates the support portions;
a first discharge channel which connects the outlet of the first cooling channel and the housing vessel; and
a second discharge channel which connects the outlets of the second cooling channels and the housing vessel.

5. The handler according to claim 4, further comprising:
a first non-return valve included in the first discharge channel to prevent flow of gas into the first cooling channel; and
a second non-return valve included in the second discharge channel to prevent flow of gas into the second cooling channel.

6. The handler according to claim 5, wherein a portion of the second discharge channel on the downstream side with respect to the second non-return valve is joined with a portion of the first discharge channel on the downstream side with respect to the first non-return valve.

7. The handler according to claim 6, further comprising:
a temperature raising unit which raises the temperature of refrigerant passing through the first discharge channel in a portion of the first discharge channel on the downstream side with respect to the position where the second discharge channel is joined with the first discharge channel.

8. The handler according to claim 1, further comprising:
a plurality of second cooling channels;
a first throttle valve which decreases the flow amount of refrigerant flowing in the first cooling channel; and a corresponding second throttle valve provided for each of the plurality of second cooling channels to decrease the amount of refrigerant flowing in each of the plurality of second cooling channels.

\* \* \* \* \*